US012677594B2

(12) United States Patent
Bong et al.

(10) Patent No.: US 12,677,594 B2
(45) Date of Patent: Jul. 7, 2026

(54) THERMOELECTRIC MODULE

(71) Applicant: LG INNOTEK CO., LTD., Seoul (KR)

(72) Inventors: Sang Hoon Bong, Seoul (KR); Boone Won, Seoul (KR); Yong Sang Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 19/124,935

(22) PCT Filed: Nov. 9, 2023

(86) PCT No.: PCT/KR2023/017995
§ 371 (c)(1),
(2) Date: Apr. 28, 2025

(87) PCT Pub. No.: WO2024/101926
PCT Pub. Date: May 16, 2024

(65) Prior Publication Data
US 2026/0182248 A1     Jun. 25, 2026

(30) Foreign Application Priority Data

Nov. 10, 2022     (KR) ........................ 10-2022-0149381
Nov. 8, 2023     (KR) ........................ 10-2023-0153539

(51) Int. Cl.
*H10N 10/17* (2023.01)
(52) U.S. Cl.
CPC .................................. *H10N 10/17* (2023.02)
(58) Field of Classification Search
None
See application file for complete search history.

(56) References Cited

U.S. PATENT DOCUMENTS

| | | | |
|---|---|---|---|
| 9,234,448 B2 | 1/2016 | Schmidt et al. | |
| 2021/0167269 A1* | 6/2021 | Bong ..................... | H10N 10/17 |
| 2023/0329112 A1* | 10/2023 | Lee ........................ | H10N 10/17 |
| | | | 136/200 |

FOREIGN PATENT DOCUMENTS

| | | |
|---|---|---|
| KR | 10-2019-0065763 | 6/2019 |
| KR | 10-2021-0069432 | 6/2021 |

(Continued)

OTHER PUBLICATIONS

International Search Report dated Feb. 13, 2024 issued in Application No. PCT/KR2023/017995.

*Primary Examiner* — Eli S Mekhlin
(74) *Attorney, Agent, or Firm* — KED & ASSOCIATES, LLP

(57) ABSTRACT

A thermoelectric module according to an embodiment of the present invention includes: a cooling jacket with through-holes through which fluid can flow; a first thermoelectric element disposed on the cooling jacket; and a first shield member disposed on the first thermoelectric element and being thermally conductive, wherein the first thermoelectric element includes: a first substrate; a semiconductor device disposed on the first substrate; a second substrate disposed on the semiconductor device; a first electrode disposed between the first substrate and the semiconductor device; and a second electrode disposed between the second substrate and the semiconductor device, and the first shield member includes an overlapping portion disposed in a region where the first electrode and the second electrode overlap.

20 Claims, 13 Drawing Sheets

(56)     References Cited

FOREIGN PATENT DOCUMENTS

| KR | 10-2021-0119800 | 10/2021 |
| KR | 10-2022-0037173 | 3/2022 |

* cited by examiner

[FIG. 1]
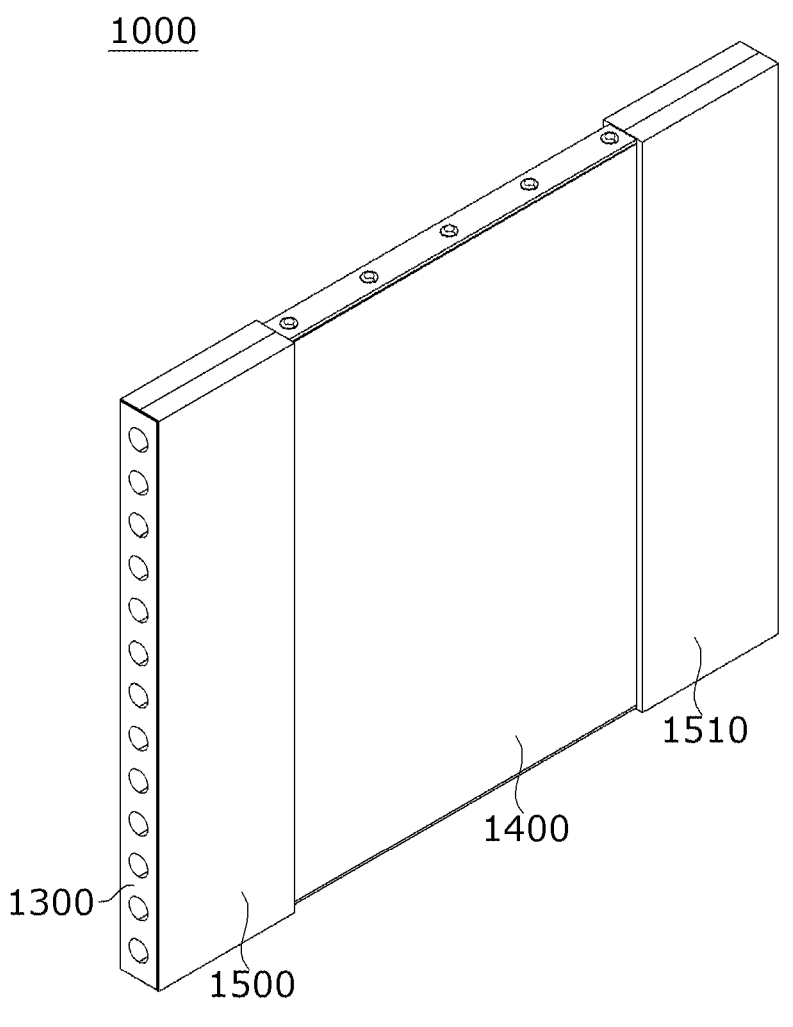
1000
1510
1400
1300
1500
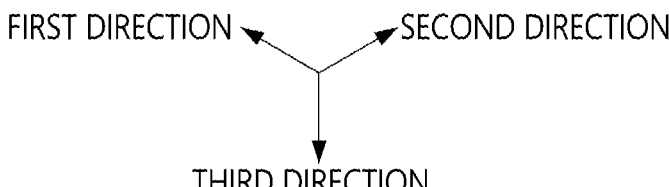
FIRST DIRECTION　　　SECOND DIRECTION
THIRD DIRECTION

[FIG. 2]
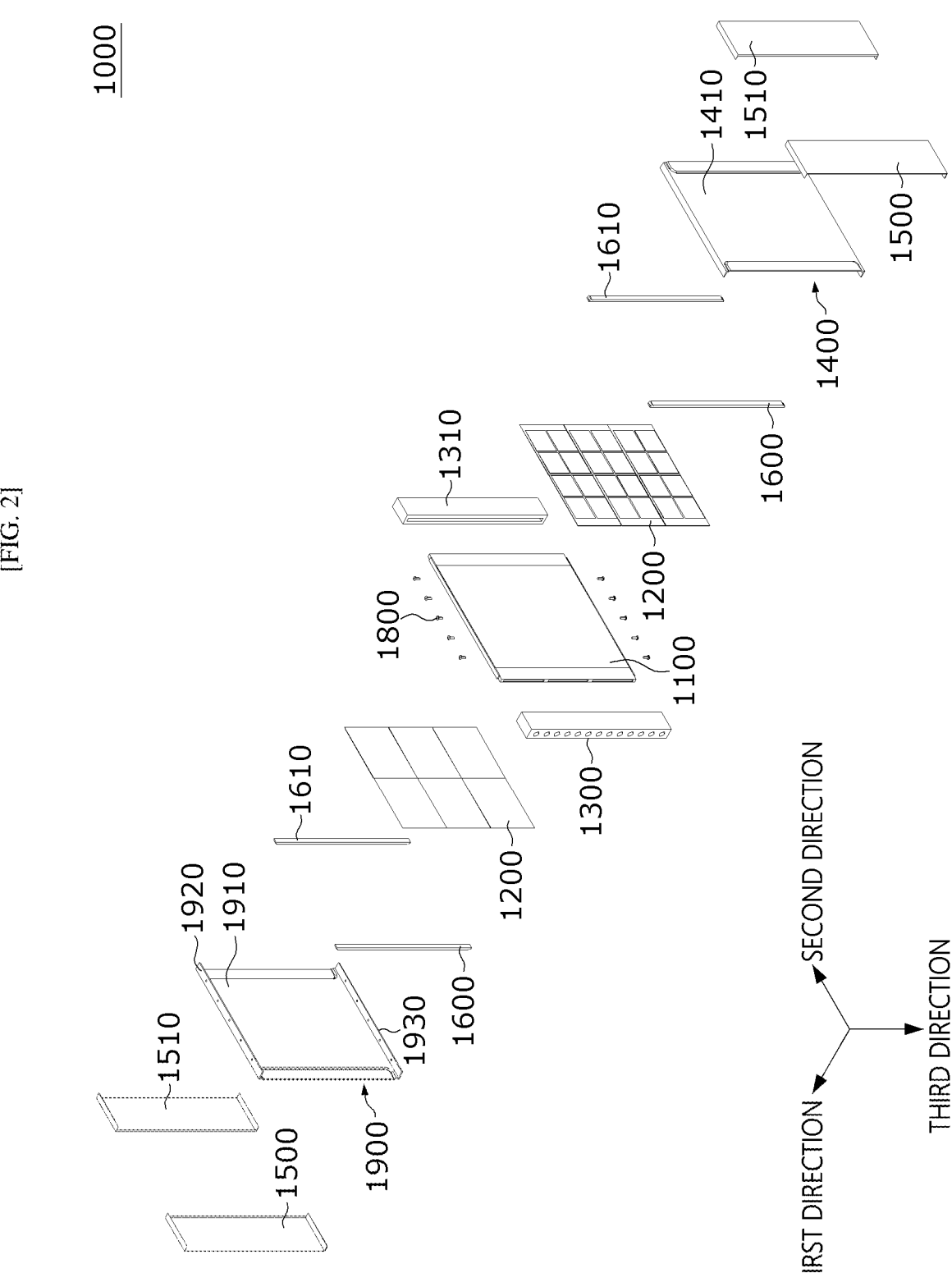

[FIG. 3]
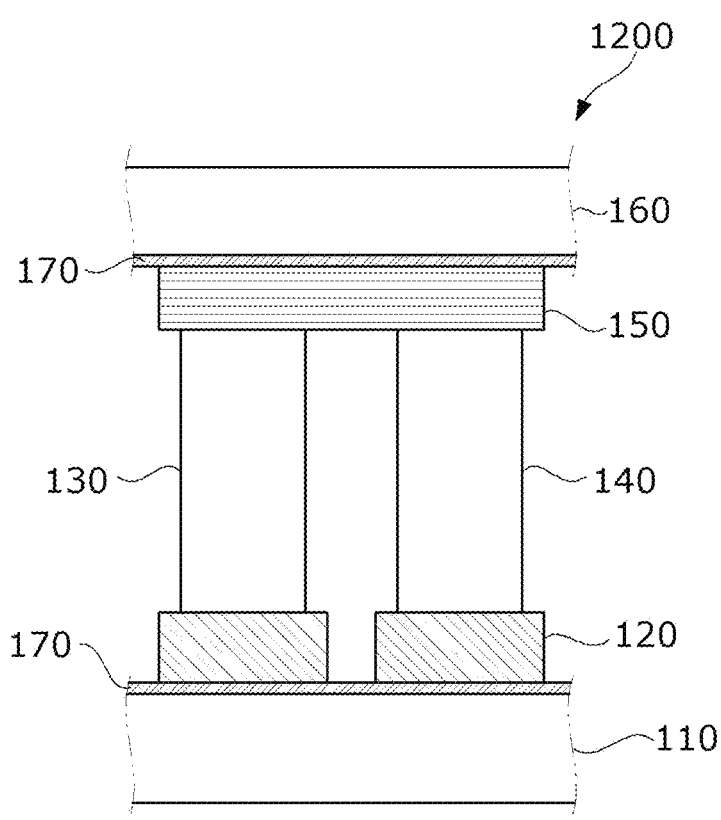

[FIG. 4]
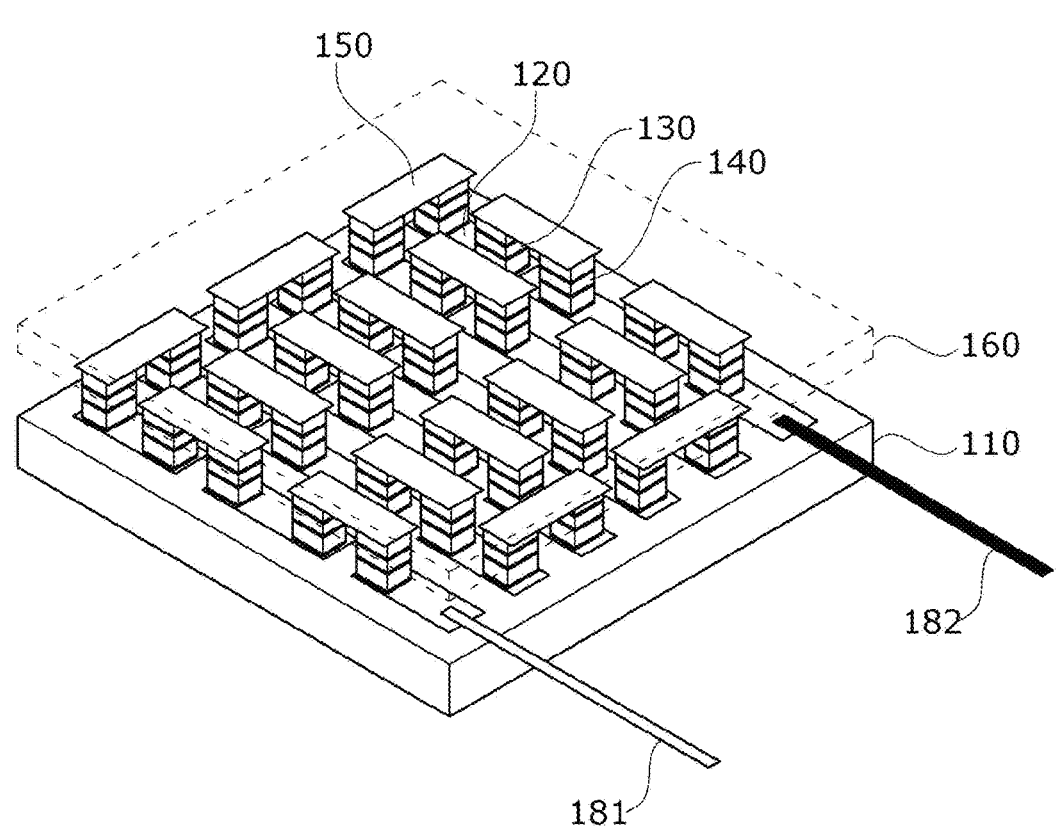

[FIG. 5]
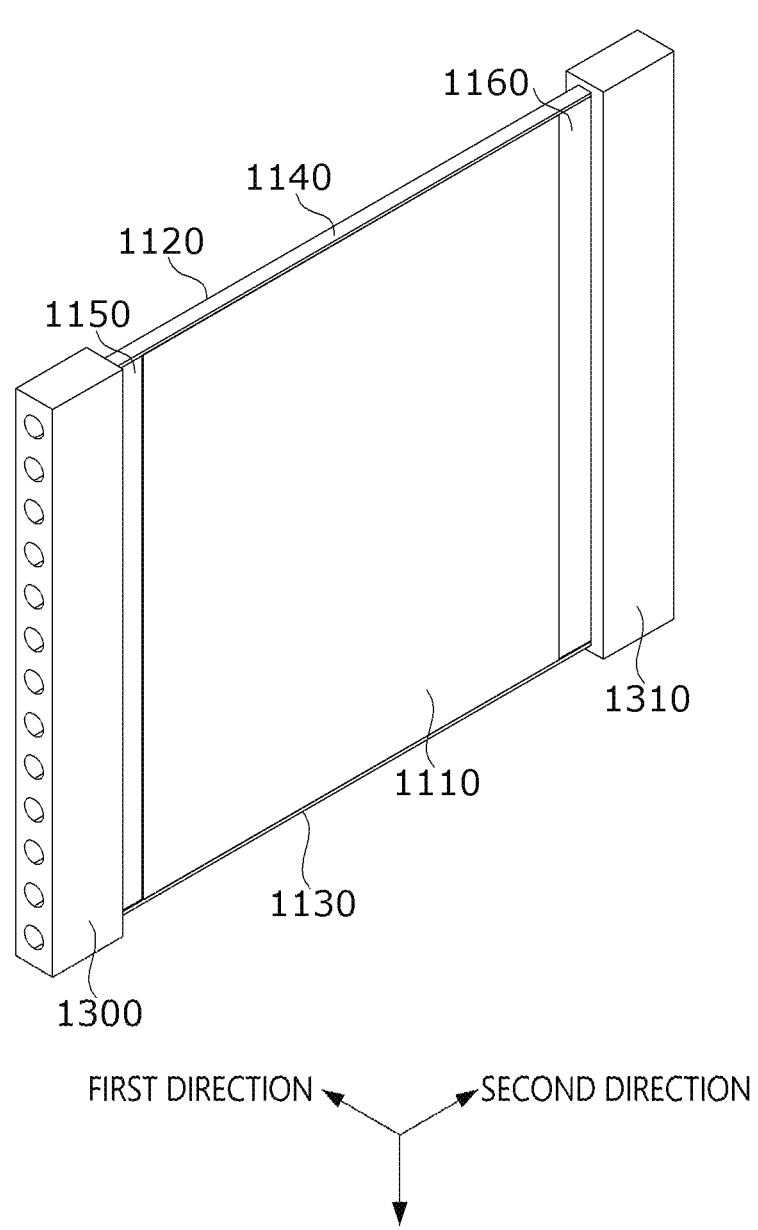
FIRST DIRECTION ← → SECOND DIRECTION
↓ THIRD DIRECTION

[FIG. 6]
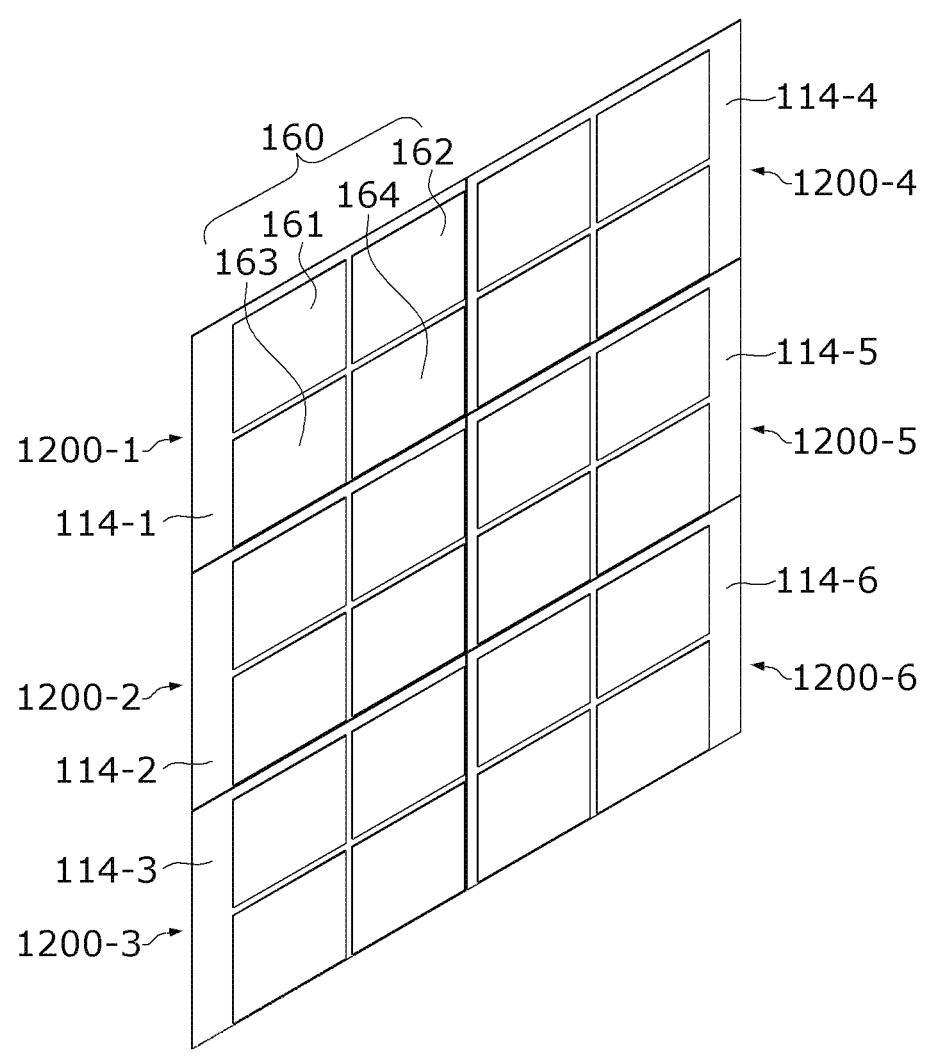
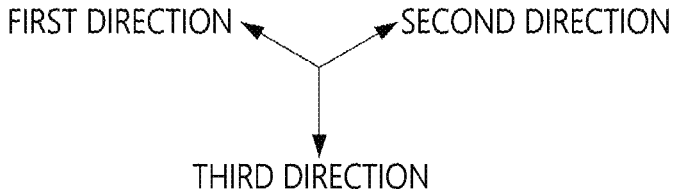

[FIG. 7]
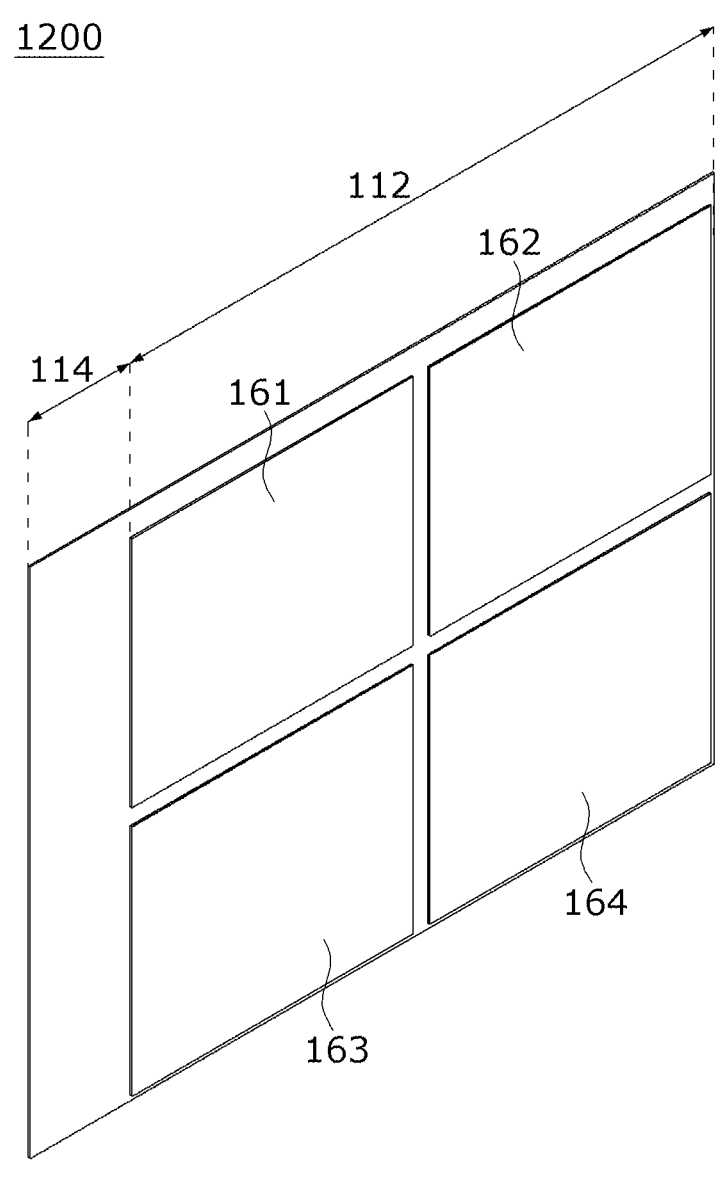
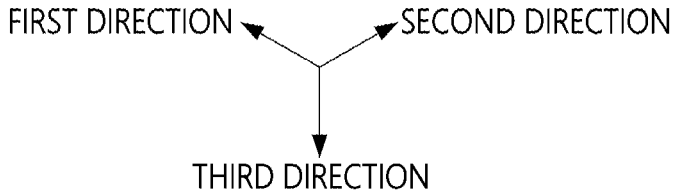

[FIG. 9A]
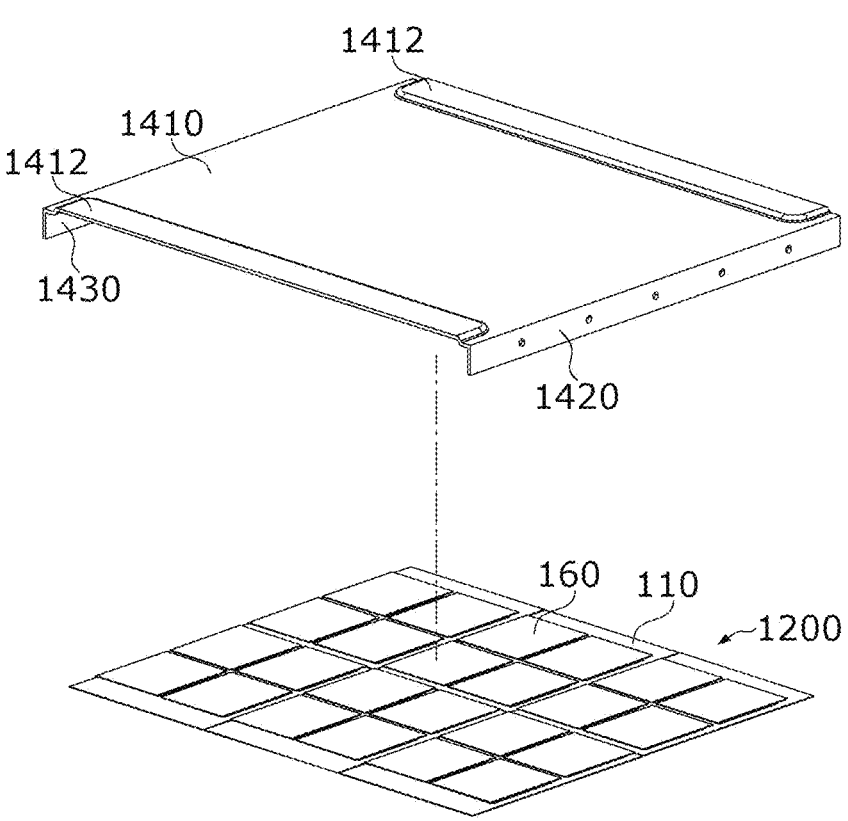

[FIG. 9B]
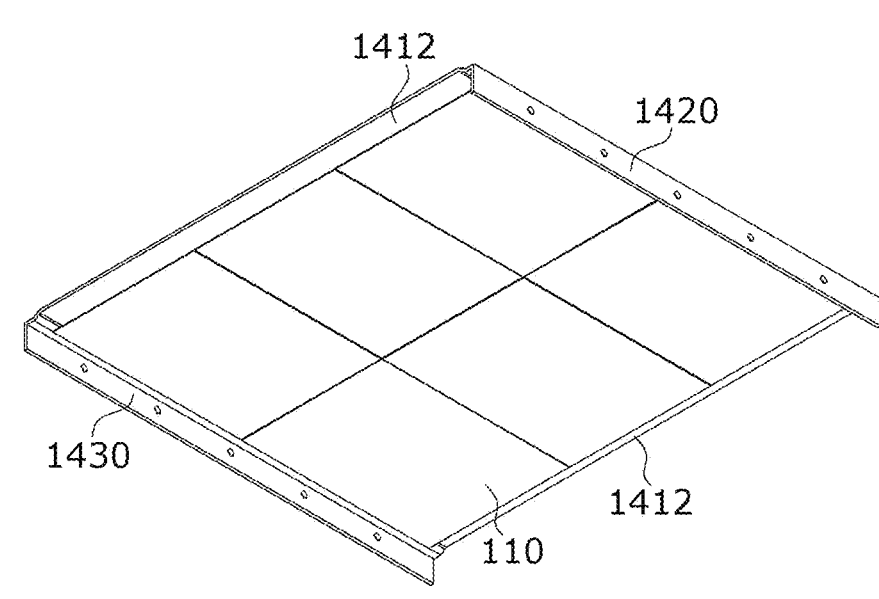

[FIG. 9C]
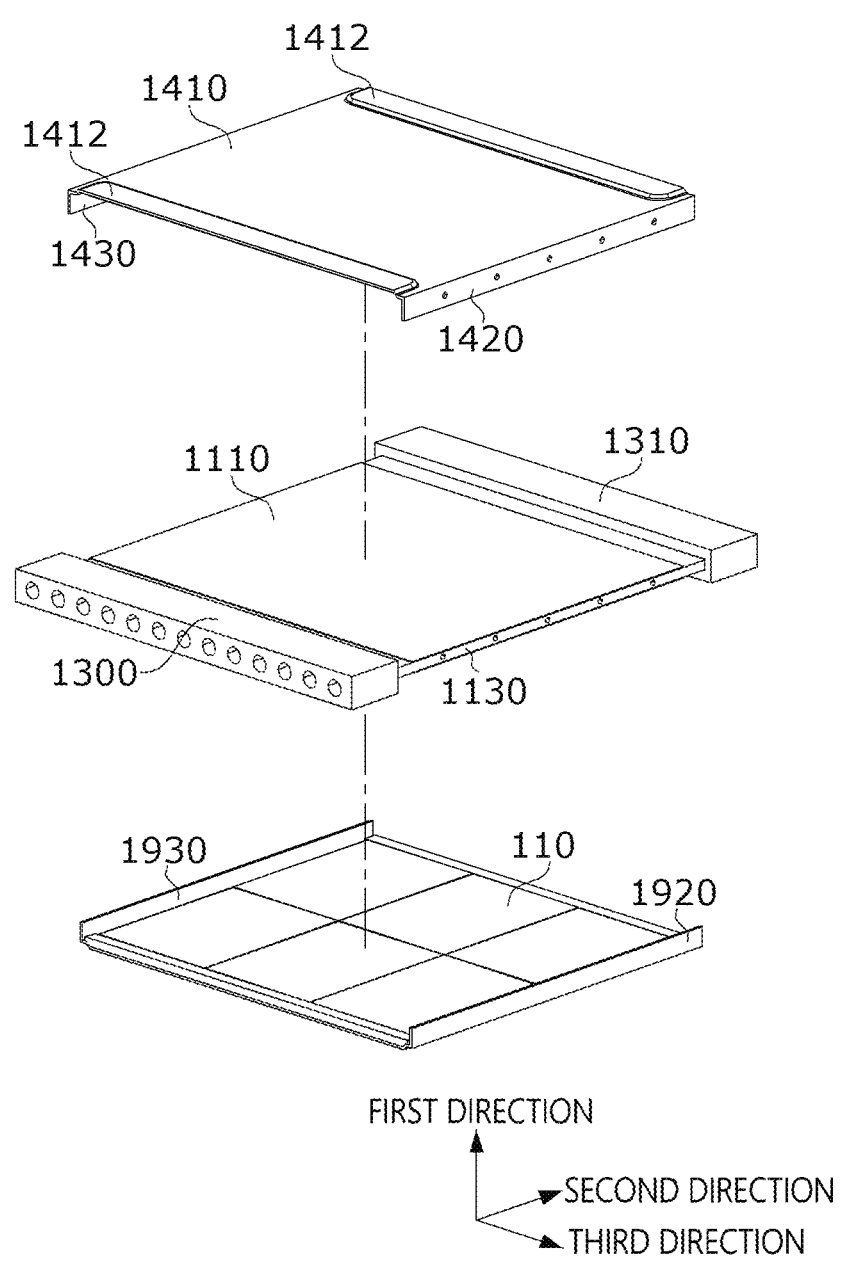

[FIG. 10]
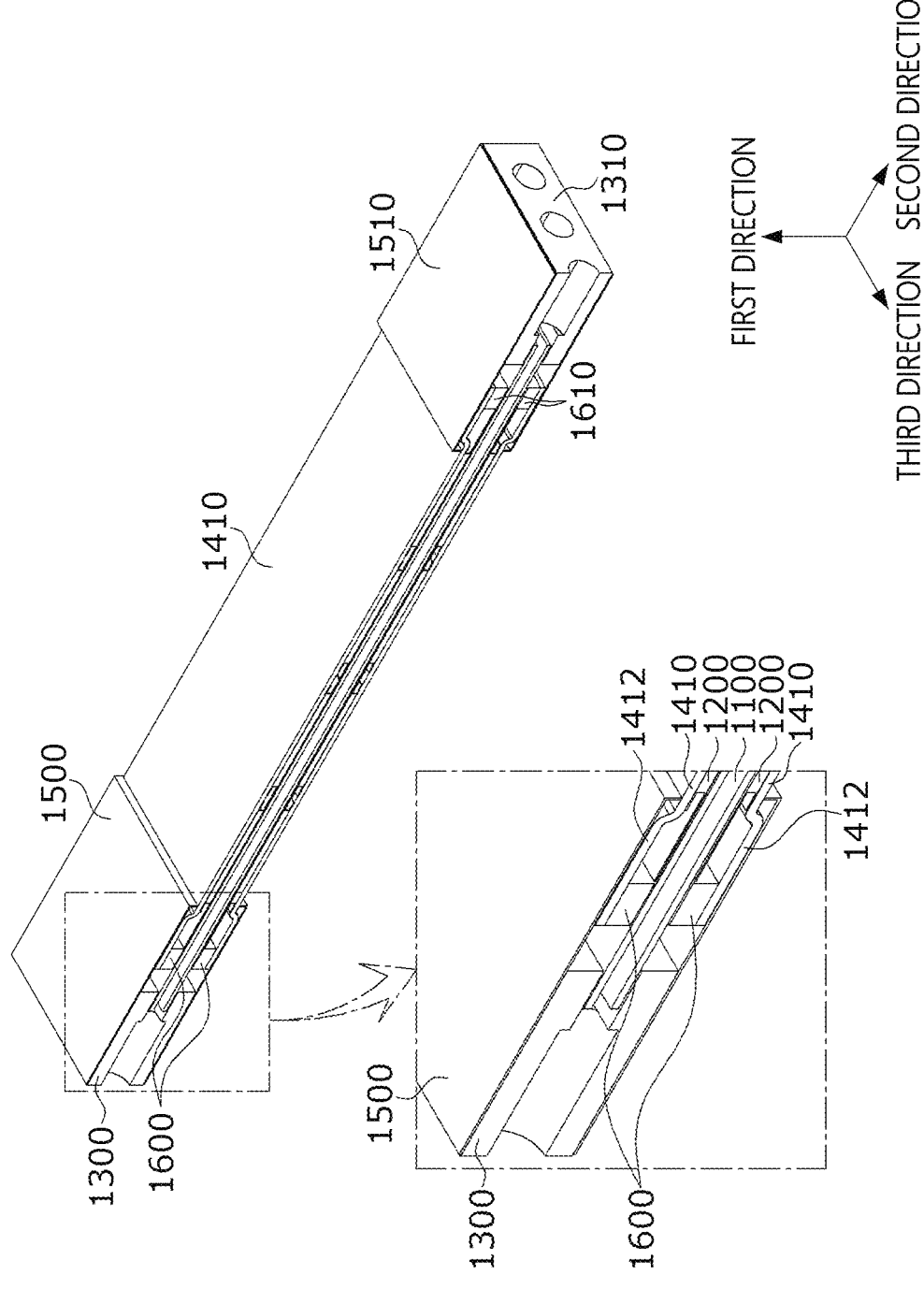

[FIG. 11]
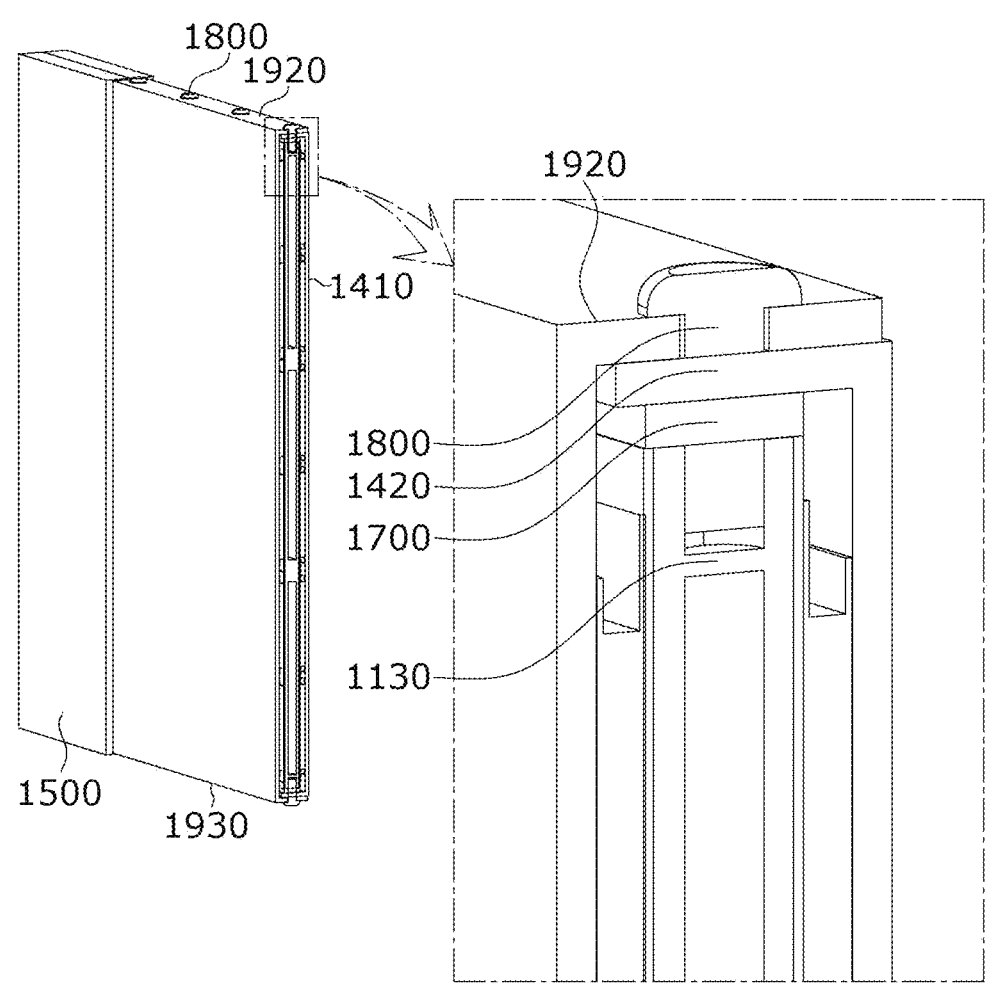

THERMOELECTRIC MODULE

CROSS-REFERENCE TO RELATED PATENT APPLICATIONS

This application is a U.S. National Stage Application under 35 U.S.C. § 371 of PCT Application No. PCT/KR2023/017995, filed Nov. 9, 2023, which claims priority to Korean Patent Application Nos. 10-2022-0149381, filed Nov. 10, 2022 and 10-2023-0153539, filed Nov. 8, 2023, whose entire disclosures are hereby incorporated by reference.

TECHNICAL FIELD

The present invention relates to a thermoelectric module, and more specifically, to a thermoelectric module that utilizes a temperature difference between a low temperature part and a high temperature part of a thermoelectric element.

BACKGROUND ART

A thermoelectric effect is a phenomenon that occurs due to movement of electrons and holes within a material, involving direct energy conversion between heat and electricity.

"Thermoelectric element" is a general term for elements that utilize the thermoelectric phenomenon, and a thermoelectric element has a structure in which a PN junction pair is formed by bonding a P-type thermoelectric material and an N-type thermoelectric material between metal electrodes.

Thermoelectric elements may be classified into elements that utilize temperature changes in electrical resistance, elements that utilize the Seebeck effect which is a phenomenon in which an electromotive force is generated by a temperature difference, and elements that utilize the Peltier effect which is a phenomenon in which heat absorption or heat generation occurs due to an electric current.

Thermoelectric elements are widely used in home appliances, electronic components, and communication components. For example, thermoelectric elements may be used in cooling devices, heating devices, and power generation devices. Thus, the demand for thermoelectric performance of thermoelectric elements is increasing.

Recently, there has been a need to generate electricity using thermoelectric elements and high temperature heat in automobiles, ships, and the like. In this case, a cooling jacket through which a first fluid passes is disposed on the low temperature part side of the thermoelectric element, a heat sink is disposed on the high temperature part side of the thermoelectric element, and a second fluid having a higher temperature than the first fluid may pass through the heat sink. Accordingly, electricity can be generated by a temperature difference between the low temperature part and the high temperature part of the thermoelectric element.

DETAILED DESCRIPTION OF INVENTION

Technical Problem

The present invention is directed to providing a thermoelectric module that utilizes a temperature difference between a low temperature part and a high temperature part of a thermoelectric element.

Technical Solution

A thermoelectric module according to an embodiment of the present invention includes a cooling jacket having through holes through which a fluid flows, a first thermoelectric element disposed on the cooling jacket, and a first shield member disposed on the first thermoelectric element and having thermal conductivity, wherein the first thermoelectric element includes a first substrate, a semiconductor device disposed on the first substrate, a second substrate disposed on the semiconductor device, a first electrode disposed between the first substrate and the semiconductor device, and a second electrode disposed between the second substrate and the semiconductor device, and the first shield member includes an overlapping portion disposed in a region in which the first electrode and the second electrode overlap.

The thermoelectric module may further include thermal grease disposed between the cooling jacket and the first thermoelectric element.

The first thermoelectric element and the first shield member may be coupled to each other.

The thermoelectric module may further include a bonding layer disposed between the first thermoelectric element and the first shield member.

The bonding layer may include solder.

The thermoelectric module may further include a wiring portion electrically connected to the first thermoelectric element, the first shield member may include a stepped portion configured to form a stepped portion with the overlapping portion, the second substrate of the first thermoelectric element may be disposed between the cooling jacket and the overlapping portion, and the wiring portion may be disposed between the cooling jacket and the stepped portion.

The thermoelectric module may further include a fluid inlet disposed at one end of the cooling jacket, and a fluid outlet disposed at the other end of the cooling jacket, the through hole may extend from the fluid inlet to the fluid outlet, and the wiring portion may be disposed between the fluid inlet and the first thermoelectric element or between the fluid outlet and the first thermoelectric element.

The thermoelectric module may further include a dummy guide disposed between the cooling jacket and the stepped portion, and the dummy guide may be disposed between the fluid inlet and the wiring portion or between the fluid outlet and the wiring portion.

The thermoelectric module may further include a first shield tube disposed on the fluid inlet and the stepped portion of the first shield member, and a second shield tube disposed on the fluid outlet and the stepped portion of the first shield member.

The thermoelectric module may further include a sealing material disposed between the fluid inlet and the dummy guide under the first shield tube or between the fluid outlet and the dummy guide under the second shield tube.

The first shield member may further include a first extension portion disposed on one side surface of the cooling jacket and a second extension portion disposed on the other side surface of the cooling jacket, and may further include an insulating member disposed between one side surface of the cooling jacket and the first extension portion and between the other side surface of the cooling jacket and the second extension portion.

The one side surface of the cooling jacket and the first extension portion, and the other side surface of the cooling jacket and the second extension portion may be coupled by a fastening member.

The first thermoelectric element may be disposed on a first surface of the cooling jacket, the thermoelectric module further include a second thermoelectric element disposed on a second surface of the cooling jacket opposite to the first surface, and a second shield member disposed on the second thermoelectric element and having thermal conductivity.

The first shield member may include a first extension portion disposed on one side surface of the cooling jacket and a second extension portion disposed on the other side surface of the cooling jacket, the second shield member may include a third extension portion disposed on one side surface of the cooling jacket and a fourth extension portion disposed on the other side surface of the cooling jacket, the first extension portion and the third extension portion may be disposed to overlap each other, and the second extension portion and the fourth extension portion may be disposed to overlap each other.

A distance between the first extension portion and the second extension portion may be different from a distance between the third extension portion and the fourth extension portion.

The third extension portion may be disposed between the first extension portion and one side surface of the cooling jacket, and the fourth extension portion may be disposed between the second extension portion and the other side surface of the cooling jacket.

Advantageous Effects

According to an embodiment of the present invention, it is possible to obtain a thermoelectric module which has a simple structure, is easily assembled, and is capable of accommodating a maximum number of thermoelectric elements within a predetermined space.

According to the embodiment of the present invention, it is possible to obtain a thermoelectric module having high thermoelectric performance by increasing a temperature difference between a high temperature part and a low temperature part.

The thermoelectric module according to the embodiment of the present invention can be applied to a power generation device that generates electricity using the temperature difference between the high temperature part and the low temperature part.

The thermoelectric module according to the embodiment of the present invention can be applied to a Peltier device that cools or heats a specific target such as a fluid.

DESCRIPTION OF DRAWINGS

FIG. 1 is a perspective view of a thermoelectric module according to an embodiment of the present invention.

FIG. 2 is an exploded perspective view of the thermoelectric module according to the embodiment of the present invention.

FIGS. 3 and 4 illustrate a thermoelectric element according to the embodiment of the present invention.

FIG. 5 is a perspective view of a cooling jacket included in the thermoelectric module according to the embodiment of the present invention.

FIG. 6 is a perspective view of a plurality of thermoelectric elements included in the thermoelectric module according to the embodiment of the present invention.

FIG. 7 is a perspective view of one of the plurality of thermoelectric elements included in the thermoelectric module according to the embodiment of the present invention.

Figure 8:
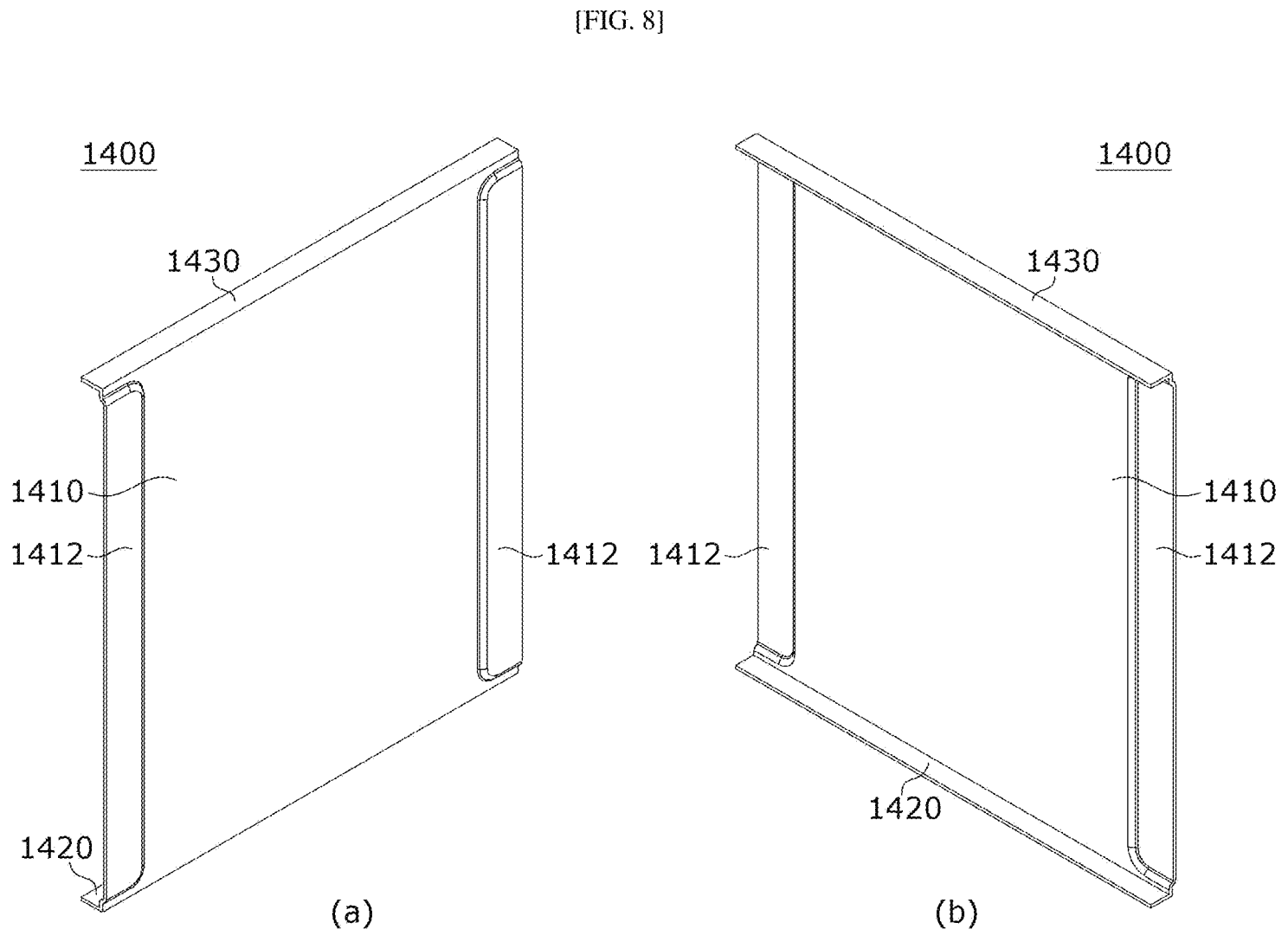

FIG. 8 (*a*) and (*b*) are perspective views of a shield member included in the thermoelectric module according to the embodiment of the present invention.

FIGS. 9A to 9C are drawings for describing joining between the shield member, the plurality of thermoelectric elements, and the cooling jacket included in the thermoelectric module according to the embodiment of the present invention.

FIG. 10 is a second direction cross-sectional perspective view of the thermoelectric module according to the embodiment of the present invention.

FIG. 11 is a third direction cross-sectional perspective view of the thermoelectric module according to the embodiment of the present invention.

MODES OF THE INVENTION

Exemplary embodiments of the present invention will be described in detail below with reference to the accompanying drawings.

However, the technical idea of the present invention is not limited to the described embodiments, but can be implemented in various different forms, and within the scope of the technical idea of the present invention, one or more of the components among the embodiments may be selectively combined or substituted and used.

In addition, the terms (including technical and scientific terms) used in the embodiments of the present invention may be interpreted as having meanings that are generally understood by a person of ordinary skill in the technical field to which the present invention belongs, unless explicitly and specifically defined and described, and commonly used terms such as terms defined in dictionaries may be interpreted in consideration of their contextual meaning in the related art.

Additionally, the terms used in the embodiments of the present invention are for the purpose of describing the embodiments and are not intended to limit the present invention.

In this specification, the singular may also include the plural unless the context clearly dictates otherwise, and the description "at least one (or one or more) of A, B, and C" may include one or more of all possible combinations of A, B, and C.

Additionally, in describing components of embodiments of the present invention, terms such as "first," "second," "A," "B," "(a)," "(b)," or the like may be used.

These terms are only intended to distinguish one component from another, and are not intended to limit the nature, order, or sequence of the component.

In addition, when a component is described as being "connected," "coupled," or "linked" to another component, it may include not only cases in which the component is directly connected, coupled, or linked to the other component, but also cases in which the component is "connected," "coupled," or "linked" by another component between the component and the other component.

Additionally, when a component is described as being formed or disposed "on (above) or below (under)" another component, "above" or "below" includes not only cases in which the two components are in direct contact with each other, but also cases in which one or more other components are formed or disposed between the two components. Additionally, when expressed as "above or below," it can include the meaning of not only the upward direction but also the downward direction based on one component.

FIG. 1 is a perspective view of a thermoelectric module according to an embodiment of the present invention, FIG. 2 is an exploded perspective view of the thermoelectric module according to the embodiment of the present invention, FIGS. 3 and 4 illustrate a thermoelectric element according to the embodiment of the present invention, FIG. 5 is a perspective view of a cooling jacket included in the thermoelectric module according to the embodiment of the present invention, FIG. 6 is a perspective view of a plurality of thermoelectric elements included in the thermoelectric module according to the embodiment of the present invention, FIG. 7 is a perspective view of one of the plurality of thermoelectric elements included in the thermoelectric module according to the embodiment of the present invention, FIG. 8 is a perspective view of a shield member included in the thermoelectric module according to the embodiment of the present invention, FIGS. 9A to 9C are drawings for describing joining between the shield member, the plurality of thermoelectric elements, and the cooling jacket included in the thermoelectric module according to the embodiment of the present invention, FIG. 10 is a second direction cross-sectional perspective view of the thermoelectric module according to the embodiment of the present invention, and FIG. 11 is a third direction cross-sectional perspective view of the thermoelectric module according to the embodiment of the present invention.

Referring to FIGS. 1 and 2, the thermoelectric module 1000 includes a cooling jacket 1100, a thermoelectric element 1200 disposed on the surface of the cooling jacket 1100, and a shield member 1400 disposed on the thermoelectric element 1200. Additionally, the thermoelectric module 1000 may further include a shield tube 1500 disposed on the shield member 1400 at both ends of the cooling jacket 1100.

The thermoelectric module 1000 according to the embodiment of the present invention may generate power utilizing a temperature difference between a first fluid flowing through the inside of the cooling jacket 1100 and a second fluid passing through the outside of the cooling jacket 1100. Although not shown, a plurality of thermoelectric modules 1000 may be disposed apart in parallel at a predetermined interval to form a thermoelectric system. Accordingly, thermoelectric performance or power generation performance per unit area can be maximized. The thermoelectric module may be referred to as a power generation device, and the thermoelectric system may be referred to as a power generation system.

The first fluid introduced into the cooling jacket 1100 may be water, but is not limited thereto, and may be various types of fluid having cooling performance. A temperature of the first fluid introduced into the cooling jacket 1100 may be less than 100° C., preferably less than 50° C., and more preferably less than 40° C., but is not limited thereto, and the fluid may be a fluid having a lower temperature than the second fluid. A temperature of the first fluid that is discharged after passing through the cooling jacket 1100 may be higher than the temperature of the first fluid introduced into the cooling jacket 1100.

Referring to FIGS. 1, 2, and 5, according to the embodiment of the present invention, the thermoelectric element 1200 may be disposed on each of a first surface 1110 of the cooling jacket 1100 and a second surface 1120 facing the first surface 1110. The first fluid may flow from one end 1150 between the first surface 1110 and the second surface 1120 toward the other end 1160 opposite to the one end 1150 between the first surface 1110 and the second surface 1120. To this end, a fluid inlet 1300 may be disposed at one end 1150 of the cooling jacket 1100, and a fluid outlet 1310 may be disposed at the other end 1160 of the cooling jacket 1100. Meanwhile, the second fluid may flow from one side surface 1140 between the first surface 1110 and the second surface

1120 toward the other side surface 1130 opposite to the one side surface 1140 between the first surface 1110 and the second surface 1120. For convenience of explanation, in this specification, a direction from the first surface 1110 to the second surface 1120 may be referred to as a first direction, a direction in which the first fluid passes may be referred to as a second direction, and a direction in which the second fluid passes may be referred to as a third direction, but these are not limited thereto.

Meanwhile, the second fluid passes through the outside of the cooling jacket 1100, for example, the high temperature part side of the thermoelectric element 1200 disposed outside the cooling jacket 1100. The second fluid may be exhaust heat or intake heat from an automobile, ship, or the like, but is not limited thereto. For example, a temperature of the second fluid may be 100° C. or higher, preferably 200° C. or higher, and more preferably 220° C. to 250° C., but is not limited thereto, and the fluid may be a fluid having a temperature higher than the first fluid.

In this specification, an example in which the temperature of the first fluid flowing through the inside of the cooling jacket 1100 is lower than the temperature of the second fluid passing through the high temperature part side of the thermoelectric element 1200 disposed outside the cooling jacket 1100 will be described. Accordingly, in this specification, the cooling jacket 1100 may be referred to as a duct, a cooling unit, a fluid flow unit, or a coolant flow unit. However, the embodiment of the present invention is not limited thereto, and the temperature of the first fluid flowing through the inside of the cooling jacket 1100 may be higher than the temperature of the second fluid passing through the high temperature part side of the thermoelectric element 1200 disposed outside the cooling jacket 1100.

Referring to FIGS. 3 and 4, the thermoelectric element 1200 includes a first substrate 110, a first electrode part 120, a P-type semiconductor device 130, an N-type semiconductor device 140, a second electrode part 150, and a second substrate 160.

The first electrode part 120 is disposed between the first substrate 110 and lower surfaces of the P-type semiconductor device 130 and the N-type semiconductor device 140, and the second electrode part 150 is disposed between the second substrate 160 and upper surfaces of the P-type semiconductor device 130 and the N-type semiconductor device 140. Accordingly, a plurality of P-type semiconductor devices 130 and a plurality of N-type semiconductor devices 140 are electrically connected by the first electrode part 120 and the second electrode part 150. A pair of a P-type semiconductor device 130 and an N-type semiconductor device 140 that are electrically connected and disposed between the first electrode part 120 and the second electrode part 150 may form a unit cell.

For example, when a voltage is applied to the first electrode part 120 and the second electrode part 150 through lead wires 181 and 182, due to the Peltier effect, the substrate through which a current flows from the P-type semiconductor device 130 to the N-type semiconductor device 140 absorbs heat and may act as a cooling part, and the substrate through which a current flows from the N-type semiconductor device 140 to the P-type semiconductor device 130 is heated and may act as a heating part. Alternatively, when a temperature difference is applied between the first electrode part 120 and the second electrode part 150, charges within the P-type semiconductor device 130 and the N-type semiconductor device 140 may move due to the Seebeck effect, and electricity may be generated.

Here, the P-type semiconductor device 130 and the N-type semiconductor device 140 may be bismuth telluride (Bi—Te)-based semiconductor devices containing bismuth (Bi) and tellurium (Te) as main raw materials. The P-type semiconductor device 130 may be a bismuth telluride (Bi—Te)-based thermoelectric leg including at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type semiconductor device 130 may include 99 to 99.999 wt % of Bi—Sb—Te as a main raw material with respect to 100 wt % of the total weight, and may include 0.001 to 1 wt % of at least one of nickel (Ni), aluminum (Al), copper (Cu), silver (Ag), lead (Pb), boron (B), gallium (Ga), and indium (In). The N-type semiconductor device 140 may be a bismuth telluride (Bi—Te)-based thermoelectric leg including at least one of selenium (Se), nickel (Ni), aluminum (Al), copper (Cu), silver (Ag), lead (Pb), boron (B), gallium (Ga), tellurium (Te), bismuth (Bi), and indium (In). For example, the N-type semiconductor device 140 may include 99 to 99.999 wt % of Bi—Se—Te as a main raw material with respect to 100 wt % of the total weight, and may include 0.001 to 1 wt % of at least one of nickel (Ni), aluminum (Al), copper (Cu), silver (Ag), lead (Pb), boron (B), gallium (Ga), and indium (In).

The P-type semiconductor device 130 and the N-type semiconductor device 140 may be formed in a bulk or laminated form. Generally, a bulk P-type semiconductor device 130 or a bulk N-type semiconductor device 140 may be obtained through a process of heat-treating a thermoelectric material to manufacture an ingot, crushing and sieving the ingot to obtain powder for a thermoelectric leg, sintering the powder, and cutting the sintered body. In this case, the P-type semiconductor device 130 and the N-type semiconductor device 140 may be polycrystalline thermoelectric legs. In this way, when the P-type semiconductor device 130 and the N-type semiconductor device 140 are polycrystalline thermoelectric legs, the strength of the P-type semiconductor device 130 and the N-type semiconductor device 140 may be increased. A laminated P-type semiconductor device 130 or a laminated N-type semiconductor device 140 may be obtained through a process of applying a paste containing a thermoelectric material on a sheet-shaped base material to form a unit member, and then laminating and cutting the unit members.

In this case, the pair of the P-type semiconductor device 130 and the N-type semiconductor device 140 may have the same shape and volume, or may have different shapes and volumes. For example, since electrical conduction characteristics of the P-type semiconductor device 130 and the N-type semiconductor device 140 are different, a height or cross-sectional area of the N-type semiconductor device 140 may be formed differently from a height or cross-sectional area of the P-type semiconductor device 130.

In this case, the P-type semiconductor device 130 or the N-type semiconductor device 140 may have a cylindrical shape, a polygonal column shape, an elliptical column shape, or the like.

In this specification, the semiconductor device may also be referred to as a thermoelectric leg, a thermoelectric structure, a semiconductor structure, or the like.

The performance of the thermoelectric element according to the embodiment of the present invention may be expressed by a figure of merit ZT. The figure of merit ZT may be expressed as shown in Equation 1.

$$ZT = \alpha^2 \cdot \sigma \cdot T / k \qquad \text{[Equation 1]}$$

Here, $\alpha$ is a Seebeck coefficient [V/K], $\sigma$ is an electrical conductivity [S/m], and $\alpha^2\sigma$ is a power factor ([W/mk$^2$]). Additionally, T is a temperature, k is a thermal conductivity [W/mK], and k may be expressed as a·cp·$\rho$, wherein a is a thermal diffusivity [cm$^2$/S], cp is a specific heat [J/gK], and p is a density [g/cm$^3$].

To obtain the figure of merit ZT of the thermoelectric element, a Z value (V/K) is measured using a Z meter, and the figure of merit ZT may be calculated using the measured Z value.

Here, the first electrode part 120 disposed between the first substrate 110 and the P-type semiconductor device 130 and the N-type semiconductor device 140, and the second electrode part 150 disposed between the second substrate 160 and the P-type semiconductor device 130 and the N-type semiconductor device 140 include at least one of copper (Cu), silver (Ag), aluminum (Al), and nickel (Ni) and may have a thickness of 0.01 mm to 0.3 mm. When the thickness of the first electrode part 120 or the second electrode part 150 is less than 0.01 mm, a function as an electrode may deteriorate and the electrical conductivity performance may be reduced, and when the thickness exceeds 0.3 mm, the conductivity efficiency may be reduced due to an increase in resistance.

Additionally, the first substrate 110 and the second substrate 160 that face each other may be metal substrates, and a thickness thereof may be 0.1 mm to 1.5 mm. When the thickness of the metal substrate is less than 0.1 mm or more than 1.5 mm, heat dissipation characteristics or thermal conductivity may become excessively high, which may deteriorate the reliability of the thermoelectric element. In addition, when the first substrate 110 and the second substrate 160 are metal substrates, an insulating layer 170 may be further formed between the first substrate 110 and the first electrode part 120 and between the second substrate 160 and the second electrode part 150. The insulating layer 170 may include a material having a thermal conductivity of 1 to 20 W/mK. In this case, the insulating layer 170 may be a layer formed of a resin composition including at least one of an epoxy resin and a silicone resin, and an inorganic material or a silicone composite including silicone and an inorganic material, or an aluminum oxide layer. Here, the inorganic material may be at least one of an oxide, nitride and carbide of aluminum, boron, silicon, or the like.

Each insulating layer 170 may be one insulating layer or a plurality of insulating layers having different compositions. At least a part of a side surface of at least one of the first electrode part 120 and the second electrode part 150 is embedded in the insulating layer 170, and an upper surface of the insulating layer 170 disposed between a plurality of electrodes included in each of the electrode parts may have a concave shape toward each of the substrates. When each insulating layer 170 is a plurality of insulating layers, at least a part of a side surface of at least one of the first electrode part 120 and the second electrode part 150 is embedded in the insulating layer 170 disposed at the top based on each of the substrates, and the uppermost surface of the insulating layer 170 disposed between the plurality of electrodes included in each of the electrode parts may have a concave shape toward each of the substrates.

In this case, sizes of the first substrate 110 and the second substrate 160 may be formed differently. That is, the volume, thickness, or area of one of the first substrate 110 and the second substrate 160 may be formed to be larger than the volume, thickness, or area of the other. Here, the thickness may be a thickness in a direction from the first substrate 110 to the second substrate 160, and the area may be an area in a direction perpendicular to the direction from the first substrate 110 to the second substrate 160. Accordingly, the heat absorption performance or heat dissipation performance of the thermoelectric element can be improved. Preferably, the volume, thickness, or area of the first substrate 110 may be formed to be larger than at least one of the volume, thickness, or area of the second substrate 160. In this case, when the first substrate 110 is disposed in a high temperature region for the Seebeck effect, when the first substrate 110 is applied to a heating region for the Peltier effect, or when a sealing member for protecting the thermoelectric element from the external environment is disposed on the first substrate 110, the first substrate 110 may have at least one of a volume, thickness, and area larger than that of the second substrate 160. In this case, the area of the first substrate 110 may be formed in a range of 1.2 to 5 times the area of the second substrate 160. When the area of the first substrate 110 is formed to be less than 1.2 times that of the second substrate 160, the effect of improving heat transfer efficiency is not significant, and when the area of the first substrate 110 exceeds 5 times, the heat transfer efficiency is significantly reduced, and it may be difficult to maintain a basic shape of the thermoelectric element.

In addition, a heat dissipation pattern, for example, a rough pattern, may be formed on the surface of at least one of the first substrate 110 and the second substrate 160. Thus, the heat dissipation performance of the thermoelectric element can be improved. When the rough pattern is formed on the surface that comes into contact with the P-type semiconductor device 130 or the N-type semiconductor device 140, bonding characteristics between the semiconductor device and the substrate can also be improved.

Although not shown, a sealing member may be additionally disposed between the first substrate 110 and the second substrate 160. The sealing member can be disposed on the side surfaces of the first electrode part 120, the P-type semiconductor device 130, the N-type semiconductor device 140, and the second electrode part 150 between the first substrate 110 and the second substrate 160. Thus, the first electrode part 120, the P-type semiconductor device 130, the N-type semiconductor device 140, and the second electrode part 150 may be sealed from external moisture, heat, contamination, or the like.

Referring again to FIGS. 1 and 2, the thermoelectric element 1200 may be disposed on each of the first surface 1110 and the second surface 1120 of the cooling jacket 1100.

As described above, each of the thermoelectric elements 1200 includes the first substrate 110 disposed in contact with the cooling jacket 1100, the first electrode part 120 disposed on the first substrate 110, a plurality of semiconductor devices 130 and 140 disposed on the first electrode part 120, the second electrode part 150 disposed on the plurality of semiconductor devices 130 and 140, and the second substrate 160 disposed on the second electrode part 150. In this case, the first substrate 110 of the thermoelectric element 1200 disposed on the cooling jacket 1100 may be a metal substrate, and the metal substrate may be bonded to the surface of the cooling jacket 1100 by a thermal interface material (TIM, not shown). The TIM may be, for example, thermal grease. Since the metal substrate has excellent heat transfer performance, heat transfer between the thermoelectric element 1200 and the cooling jacket 1100 is easily performed. In addition, when the metal substrate and the cooling jacket 1100 are bonded by the TIM, heat transfer between the metal substrate and the cooling jacket 1100 may not be hindered. In particular, when the metal substrate and the cooling jacket 1100 are bonded by a heat transfer material, the withstand voltage performance is higher and assembly is easier compared to when the metal substrate and the cooling jacket 1100 are bonded by a fastening member. Here, the metal substrate may be one of a copper substrate, an aluminum substrate, and a copper-aluminum substrate, but is not limited thereto.

Meanwhile, according to the embodiment of the present invention, the thermoelectric module 1000 further includes the shield member 1400 disposed on the thermoelectric element 1200 outside the cooling jacket 1100. The shield member 1400 includes an overlapping portion 1410 disposed on a region in which the first electrode part 120 and the second electrode part 150 of the thermoelectric element 1200 overlap.

As shown in FIGS. 1 and 2, the overlapping portion 1410 is disposed to cover the entire region in which the first electrode part 120 and the second electrode part 150 of the thermoelectric element 1200 overlap. That is, the second substrate 160 of the thermoelectric element 1200 is covered by the overlapping portion 1410, and a through hole for exposing the heat sink to the outside is not formed in the overlapping portion 1410. Accordingly, the heat sink disposed on the second substrate 160 of the thermoelectric element 1200 may be omitted.

Referring again to FIG. 5, at least one hole is formed in each of the fluid inlet 1300 and the fluid outlet 1310 disposed in one end 1150 and the other end 1160 of the cooling jacket 1100, and the first fluid introduced through at least one hole formed in the fluid inlet 1300 may pass through the cooling jacket 1100 and then be discharged through at least one hole formed in the fluid outlet 1310. At least one hole formed in the fluid inlet 1300 may pass through the cooling jacket 1100 and extend to at least one hole formed in the fluid outlet 1310.

Referring to FIGS. 1, 2, and 5 to 7, a plurality of thermoelectric elements 1200-1, . . . , and 1200-N are disposed on the first surface 1110 of the cooling jacket 1100, and similarly, a plurality of thermoelectric elements may be disposed on the second surface 1120 of the cooling jacket 1100. Here, six thermoelectric elements are shown to be disposed on one surface of the cooling jacket 1100, but this is only an example and is not limiting. With regard to the thermoelectric element, duplicate description of the same content described with reference to FIGS. 3 and 4 will be omitted.

Referring to FIGS. 6 and 7, each of the thermoelectric modules 1200 according to the embodiment of the present invention includes the first substrate 110, the first electrode disposed on the first substrate 110, the semiconductor device disposed on the first electrode, the second electrode disposed on the semiconductor device, and the second substrate 160 disposed on the second electrode.

According to the embodiment of the present invention, the first substrate 110 may be disposed in direct contact with the first surface 1110 of the cooling jacket 1100, or may be disposed in indirect contact with the first surface 1110 through the TIM, or the like. The first substrate 110 may include a thermoelectric element region 112 vertically overlapping the second substrate 160 and a wiring region 114 disposed on a side surface of the thermoelectric element region 112. The first electrode, the semiconductor device, the second electrode, and the second substrate 160 are sequentially disposed on the thermoelectric element region 112 of the first substrate 110, and a wiring portion (not shown) electrically connected to the thermoelectric element region 112 may be disposed in the wiring region 114 of the first substrate 110. Here, the wiring portion may include a lead wire connected to the first electrode disposed in the thermoelectric element region 112 and a connector connected to the lead wire.

The plurality of adjacent thermoelectric elements may be electrically connected to each other through the connectors disposed in the wiring region 114. For example, as shown in FIG. 6, when the first to third thermoelectric elements 1200-1, 1200-2, and 1200-3 are disposed adjacent to each other and the fourth to sixth thermoelectric elements 1200-4, 1200-5, and 1200-6 are disposed adjacent to each other, the wiring regions 114-1, 114-2, and 114-3 of the first to third thermoelectric elements 1200-1, 1200-2, and 1200-3 are disposed in a row and electrically connected to each other through the connectors, and the wiring regions 114-4, 114-5, and 114-6 of the fourth to sixth thermoelectric elements 1200-4, 1200-5, and 1200-6 are disposed in a row and may be electrically connected to each other through the connectors. In this case, the wiring regions 114-1, 114-2, and 114-3 of the first to third thermoelectric elements 1200-1, 1200-2, and 1200-3 may be disposed at one end 1150 of the cooling jacket 1100, that is, on the fluid inlet 1300 side, and the wiring regions 114-4, 114-5, and 114-6 of the fourth to sixth thermoelectric elements 1200-4, 1200-5, and 1200-6 may be disposed at the other end 1160 of the cooling jacket 1100, that is, on the fluid outlet 1310 side. That is, the wiring portion disposed in the wiring region 114-1, 114-2, and 114-3 of the first to third thermoelectric elements 1200-1, 1200-2, and 1200-3 may be disposed between the fluid inlet 1300 and the first to third thermoelectric elements 1200-1, 1200-2, and 1200-3, and the wiring portion disposed in the wiring regions 114-4, 114-5, and 114-6 of the fourth to sixth thermoelectric elements 1200-4, 1200-5, and 1200-6 may be disposed between the fluid outlet 1310 and the fourth to sixth thermoelectric elements 1200-4, 1200-5, and 1200-6.

According to the embodiment of the present invention, the second substrate 160 of each of the thermoelectric elements 1200 may include a plurality of split substrates 161, 162, 163, and 164 disposed apart from each other. Here, four split substrates 161, 162, 163, and 164 are exemplified for one first substrate 110, but are not limited thereto. The second substrate 160 disposed on one first substrate 110 may include two or more split substrates. Accordingly, when the second substrate 160 is bonded to the shield member 1400 described below, even when the second substrate 160 undergoes thermal expansion due to the high temperature second fluid, the problem of the second substrate 160 being thermally deformed or the second substrate 160 being detached from the shield member 1400 can be minimized.

Referring to FIG. 8, the shield member 1400 may include an overlapping portion 1410, a stepped portion 1412, a first extension portion 1420, and a second extension portion 1430. The overlapping portion 1410 may be disposed on the first surface 1110 of the cooling jacket 1100, the first extension portion 1420 may be disposed on one side surface 1130 of the cooling jacket 1100, and the second extension portion 1430 may be disposed on the other side surface 1140 of the cooling jacket 1100.

Referring to FIGS. 9A to 9C, the overlapping portion 1410 of the shield member 1400 is disposed on the plurality of thermoelectric elements 1200. The overlapping portion 1410 of the shield member 1400 is disposed on a region in which the first electrodes and the second electrodes of the plurality of thermoelectric elements 1200 overlap. The overlapping portion 1410 of the shield member 1400 is disposed to cover the entire region in which the first electrodes and the second electrodes of the plurality of thermoelectric elements 1200 overlap. In this case, the plurality of thermoelectric elements 1200 may be disposed on the inner surface of the overlapping portion 1410 of the shield member 1400. Here, the inner surface of the overlapping portion 1410 of the shield member 1400 may be a surface opposite to an outer surface that comes into direct contact with the second fluid among both surfaces of the overlapping portion 1410 of the shield member 1400, that is, a surface disposed to face the cooling jacket 1100. According to the embodiment of the present invention, the plurality of thermoelectric elements 1200-1 and the shield member 1400 may be coupled or bonded. According to the embodiment of the present invention, the second substrate 160 of the plurality of thermoelectric elements 1200 may be coupled or bonded to the shield member 1400. To this end, a bonding layer (not shown) may be further disposed between the plurality of thermoelectric elements 1200 and the shield member 1400. Here, the bonding layer may include solder. For example, the second substrate 160 of the plurality of thermoelectric elements 1200 may be soldered to the inner surface of the overlapping portion 1410 of the shield member 1400. That is, the upper surface of the second substrate 160 of the plurality of thermoelectric elements 1200 may be bonded to the inner surface of the overlapping portion 1410 of the shield member 1400. For example, the entire upper surface of the second substrate 160 of the plurality of thermoelectric elements 1200 may be bonded to the inner surface of the overlapping portion 1410 of the shield member 1400. Additionally, the lower surface of the first substrate 110 of the plurality of thermoelectric elements 1200 may be bonded to the cooling jacket 1100 by the TIM, such as thermal grease. Here, the shield member 1400 is thermally conductive. For example, the shield member 1400 may be a thermally conductive metal or a thermally conductive alloy. For example, the shield member 1400 may include copper, aluminum, or stainless steel. Thus, the overlapping portion 1410 of the shield member 1400 may not only protect the plurality of thermoelectric elements 1200, but also function as a heat sink. Accordingly, the heat received by the overlapping portion 1410 of the shield member 1400 from the high temperature second fluid is directly transferred to the second substrate 160 of the plurality of thermoelectric elements 1200, and thus it is possible to prevent heat loss and improve power generation efficiency. In addition, since there is no need to separately arrange the heat sink on the second substrate 160 of the plurality of thermoelectric elements 1200, structural and process complexity due to the bonding between the second substrate 160 and the heat sink and the assembly of the shield member for exposing the heat sink to the outside can be significantly reduced.

Referring to FIGS. 8, 9A to 9C, and 10, the shield member 1400 includes the overlapping portion 1410 and two stepped portions 1412, and both the overlapping portion 1410 and the two stepped portions 1412 are disposed on the first surface 1110 of the cooling jacket 1100. The two stepped portions 1412 form steps with the overlapping portion 1410 with the overlapping portion 1410 interposed therebetween. The two stepped portions 1412 may be disposed at one end and the other end of the overlapping portion 1410. The two stepped portions 1412 may be disposed to extend along one end 1150 of the cooling jacket 1100 and the other end 1160 of the cooling jacket 1100. That is, the two stepped portions 1412 may be disposed to extend in a direction from one side surface 1130 of the cooling jacket 1100 toward the other side surface 1140 of the cooling jacket 1100. In this case, based on the first surface 1110 of the cooling jacket 1100 or the first substrate 110 of the thermoelectric element 1200, a height of the stepped portion 1412 may be higher than a height of the overlapping portion 1410. More specifically, based on the first surface 1110 of the cooling jacket 1100 or the first substrate 110 of the thermoelectric element 1200, a height of the inner surface of the stepped portion 1412 may be higher than a height of the inner surface of the overlapping portion 1410.

Meanwhile, as described above, the first substrate 110 of the thermoelectric element 1200 includes the thermoelectric element region 112 vertically overlapping the second substrate 160 and the wiring region 114 disposed on the side surface of the thermoelectric element region 112, and the wiring portion (not shown) electrically connected to the thermoelectric element region 112 may be disposed in the wiring region 114 of the first substrate 110. According to the embodiment of the present invention, the second substrate 160 of the thermoelectric element 1200 may be disposed between the cooling jacket 1100 and the overlapping portion 1410 of the shield member 1400, and the wiring portion may be disposed between the cooling jacket 1100 and the stepped portion 1412 of the shield member 1400. Accordingly, even when the inner surface of the overlapping portion 1410 of the shield member 1400 is bonded to the second substrate 160 of the thermoelectric element 1200, since the inner surface of the stepped portion 1412 of the shield member 1400 is spaced apart from the wiring portion, the wiring portion may not be electrically affected by the thermally conductive shield member 1400, and withstand voltage performance of the thermoelectric module 1000 can be improved.

In addition, when the wiring portion is disposed to extend along one end 1150 of the cooling jacket 1100 and the other end 1160 of the cooling jacket 1100, that is, the fluid inlet 1300 and the fluid outlet 1310, the influence of the high-temperature second fluid on the wiring portion can be minimized.

Meanwhile, the thermoelectric module 1000 according to the embodiment of the present invention further includes dummy guides 1600 and 1610. The dummy guides 1600 and 1610 may have at least one of thermal insulation performance and electrical insulation performance. For example, the dummy guides 1600 and 1610 may include a plastic material. The dummy guides 1600 and 1610 may be disposed between the first surface 1110 of the cooling jacket 1100 and the stepped portion 1412 of the shield member 1400. Between the first surface 1110 of the cooling jacket 1100 and the stepped portion 1412 of the shield member 1400, the dummy guides 1600 and 1610 may be disposed between the fluid inlet 1300 and the wiring portion, or between the fluid outlet 1310 and the wiring portion. Thus, the dummy guides 1600 and 1610 perform a sealing role and can protect the plurality of thermoelectric elements 1200 disposed between the first surface 1110 of the cooling jacket 1100 and the shield member 1400.

As described above, the thermoelectric module 1000 according to the embodiment of the present invention may further include a first shield tube 1500 disposed on the fluid inlet 1300 and the stepped portion 1412 of the shield member 1400 and a second shield tube 1510 disposed on the fluid outlet 1310 and a second region 1412 of the overlapping portion 1410 of the shield member 1400. The first shield tube 1500 and the second shield tube 1510 can prevent the high temperature second fluid or external foreign substances from penetrating between the fluid inlet 1300 and the shield member 1400 and into the fluid outlet 1310 and the shield member 1400. In this case, a sealing material may be additionally disposed between the fluid inlet 1300 and the dummy guide 1600 under the first shield tube 1500 or between the fluid outlet 1310 and the dummy guide 1610 under the second shield tube 1510. Accordingly, it is possible to prevent the problem of the high temperature second fluid or external foreign substances penetrating between the fluid inlet 1300 and the shield member 1400 and into the fluid outlet 1310 and the shield member 1400.

Meanwhile, referring to FIG. 11, an insulating member 1700 may be further disposed between one side surface 1130 of the cooling jacket 1100 and the first extension portion 1420 of the shield member 1400 and between the other side surface 1140 of the cooling jacket 1100 and the second extension portion 1430 of the shield member 1400. Accordingly, when the high temperature second fluid flows from the one side surface 1130 of the cooling jacket 1100 toward the other side surface 1140 or from the other side surface 1140 of the cooling jacket 1100 toward the one side surface 1130, since the heat of the high temperature second fluid is not directly transferred to the cooling jacket 1100, the cooling jacket 1100 can be protected from the high temperature.

Meanwhile, referring to FIG. 11, the one side surface 1130 of the cooling jacket 1100 and the first extension portion 1420 of the shield member 1400, and the other side surface 1140 of the cooling jacket 1100 and the second extension portion 1430 of the shield member 1400 may be coupled by a fastening member 1800. Thus, since a contact area between the fastening member 1800 and the cooling jacket 1100 is minimized, the cooling jacket 1100 can be protected from high temperatures. In particular, according to the embodiment of the present invention, since the fastening member 1800 is disposed only in the first extension portion 1420 and the second extension portion 1420 of the shield member without being disposed in the overlapping portion 1410 of the shield member 1400, the problem of the fastening member 1800 obstructing a flow path of the second fluid can be prevented, and the problem of an effective area of the thermoelectric element 1200 becoming smaller due to the fastening member 1800 can be prevented.

The description above has focused on the thermoelectric element 1200 and the shield member 1400 disposed on the first surface 1110 of the cooling jacket 1100 for convenience of explanation, but the thermoelectric element 1200 and the shield member may also be disposed on the second surface 1120 of the cooling jacket 1100 to be symmetrical with the first surface 1110 of the cooling jacket 1100.

As illustrated in FIG. 11, the first extension portion 1420 and the second extension portion 1430 of the shield member 1400 disposed on the first surface 1110 of the cooling jacket 1100 may be disposed to overlap each other on the third extension portion 1920 and the fourth extension portion 1930 of the shield member 1900 disposed on the second surface 1120 of the cooling jacket 1100 and the one side surface 1130 and the other side surface 1140 of the cooling jacket 1100. For example, the first extension portion 1420 of the shield member 1400 and the third extension portion 1920 of the shield member 1900 may be disposed to overlap each other on the one side surface 1130 of the cooling jacket 1100, and the second extension portion 1430 of the shield member 1400 and the fourth extension portion 1930 of the shield member 1900 may be disposed to overlap each other on the other side surface 1140 of the cooling jacket 1100. In this case, a distance between the first extension portion 1420 and the second extension portion 1430 of the shield member 1400 may be different from a distance between the third extension portion 1920 and the fourth extension portion 1930 of the shield member 1900. For example, the distance between the third extension portion 1920 and the fourth extension portion 1930 of the shield member 1900 may be greater than the distance between the first extension portion 1420 and the second extension portion 1430 of the shield member 1400, and thus the first extension portion 1420 of the shield member 1400 may be disposed between the third extension portion 1920 of the shield member 1900 and the one side surface 1130 of the cooling jacket 1100, and the second extension portion 1430 of the shield member 1400 may be disposed between the fourth extension portion 1930 of the shield member 1900 and the other side surface 1140 of the cooling jacket 1100. Accordingly, the shield member 1400 and the shield member 1900 can be easily assembled to the cooling jacket 1100, and in a state in which the shield member 1400 and the shield member 1900 are assembled, the penetration of the high temperature second fluid can be prevented.

The power generation system can generate power from heat sources generated in ships, automobiles, power plants, geothermal heat, and the like, and a plurality of power generation devices can be disposed to efficiently converge the heat sources. In this case, each of the power generation devices can improve cooling performance of the low temperature part of the thermoelectric element by improving the bonding strength between the thermoelectric module and the cooling jacket, and thus the efficiency and reliability of the power generation device can be improved, thereby improving fuel efficiency of transportation devices such as ships and vehicles. Therefore, in the shipping and transportation industries, it is possible to reduce transportation costs and create an eco-friendly industrial environment, and when the power generation device is applied to manufacturing industries such as steel mills, it is possible to reduce material costs, and the like.

Although the present invention has been described above with reference to preferred embodiments thereof, it will be understood by those skilled in the art that various modifications and changes may be made to the present invention without departing from the gist and scope of the present invention as set forth in the claims below.

The invention claimed is:

1. A thermoelectric module comprising:
a cooling jacket having through holes through which a fluid flows;
a first thermoelectric element disposed on the cooling jacket; and
a first shield member disposed on the first thermoelectric element and having thermal conductivity,
wherein the first thermoelectric element includes:
a first substrate;
a semiconductor device disposed on the first substrate;
a second substrate disposed on the semiconductor device;
a first electrode disposed between the first substrate and the semiconductor device; and
a second electrode disposed between the second substrate and the semiconductor device, and
wherein the first shield member includes an overlapping portion disposed in a region in which the first electrode and the second electrode overlap.

2. The thermoelectric module of claim 1, further comprising thermal grease disposed between the cooling jacket and the first thermoelectric element.

3. The thermoelectric module of claim 1, wherein the first thermoelectric element and the first shield member are coupled to each other.

4. The thermoelectric module of claim 1, further comprising a bonding layer disposed between the first thermoelectric element and the first shield member.

5. The thermoelectric module of claim 4, wherein the bonding layer includes solder.

6. The thermoelectric module of claim 1, further comprising a wiring portion electrically connected to the first thermoelectric element,
wherein the first shield member includes a stepped portion configured to form a stepped portion with the overlapping portion, and
the second substrate of the first thermoelectric element is disposed between the cooling jacket and the overlapping portion, and the wiring portion is disposed between the cooling jacket and the stepped portion.

7. The thermoelectric module of claim 6, further comprising:
a fluid inlet disposed at one end of the cooling jacket; and
a fluid outlet disposed at an other end of the cooling jacket,
wherein the through hole extends from the fluid inlet to the fluid outlet, and
the wiring portion is disposed between the fluid inlet and the first thermoelectric element or between the fluid outlet and the first thermoelectric element.

8. The thermoelectric module of claim 7, further comprising a dummy guide disposed between the cooling jacket and the stepped portion,
wherein the dummy guide is disposed between the fluid inlet and the wiring portion or between the fluid outlet and the wiring portion.

9. The thermoelectric module of claim 8, further comprising a first shield tube disposed on the fluid inlet and the stepped portion of the first shield member, and a second shield tube disposed on the fluid outlet and the stepped portion of the first shield member.

10. The thermoelectric module of claim 9, further comprising a sealing material disposed between the fluid inlet and the dummy guide under the first shield tube or between the fluid outlet and the dummy guide under the second shield tube.

11. The thermoelectric module of claim 1, wherein the first shield member further includes a first extension portion disposed on one side surface of the cooling jacket and a second extension portion disposed on an other side surface of the cooling jacket, and further includes an insulating member disposed between the one side surface of the cooling jacket and the first extension portion and between the other side surface of the cooling jacket and the second extension portion.

12. The thermoelectric module of claim 11, wherein the one side surface of the cooling jacket and the first extension portion, and the other side surface of the cooling jacket and the second extension portion are coupled by fastening members.

13. The thermoelectric module of claim 1, wherein:
the first thermoelectric element is disposed on a first surface of the cooling jacket,
the thermoelectric module further includes a second thermoelectric element disposed on a second surface of the cooling jacket opposite to the first surface, and a second shield member disposed on the second thermoelectric element and having thermal conductivity.

14. The thermoelectric module of claim 13, wherein the first shield member includes a first extension portion disposed on one side surface of the cooling jacket and a second extension portion disposed an other side surface of the cooling jacket, the second shield member includes a third  5 extension portion disposed on the one side surface of the cooling jacket and a fourth extension portion disposed on the other side surface of the cooling jacket, the first extension portion and the third extension portion are disposed to overlap each other, and the second extension portion and the  10 fourth extension portion are disposed to overlap each other.

15. The thermoelectric module of claim 14, wherein a distance between the first extension portion and the second extension portion is different from a distance between the third extension portion and the fourth extension portion.  15

16. The thermoelectric module of claim 15, wherein the third extension portion is disposed between the first extension portion and one side surface of the cooling jacket, and the fourth extension portion is disposed between the second extension portion and the other side surface of the cooling  20 jacket.

17. The thermoelectric module of claim 1, wherein the second substrate is covered by the overlapping portion.

18. The thermoelectric module of claim 17, wherein the second substrate includes a plurality of split substrates  25 disposed apart from each other.

19. The thermoelectric module of claim 1, wherein the first thermoelectric element is disposed on an inner surface of the overlapping portion.

20. The thermoelectric module of claim 19, wherein the  30 second substrate is soldered to the inner surface of the overlapping portion.

\* \* \* \* \*